（12）United States Patent
Rasti

(10) Patent No.: US 10,153,751 B2
(45) Date of Patent: Dec. 11, 2018

(54) SECOND ORDER SWITCHED CAPACITOR FILTER

(71) Applicant: SAMSUNG DISPLAY CO., LTD., Yongin, Gyeonggi-do (KR)

(72) Inventor: Nancy Rasti, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/453,824

(22) Filed: Mar. 8, 2017

(65) Prior Publication Data

US 2018/0212592 A1 Jul. 26, 2018

Related U.S. Application Data

(60) Provisional application No. 62/449,461, filed on Jan. 23, 2017.

(51) Int. Cl.
H04B 1/10 (2006.01)
H03H 19/00 (2006.01)

(52) U.S. Cl.
CPC ................... *H03H 19/004* (2013.01)

(58) Field of Classification Search
CPC .................................................. H03H 19/004
USPC ......................................................... 327/554
See application file for complete search history.

(56) References Cited

U.S. PATENT DOCUMENTS

| 4,179,665 | A | * | 12/1979 | Gregorian | ............ | H03H 19/004 327/554 |
| 4,210,872 | A | * | 7/1980 | Gregorian | .............. | H03H 15/00 330/107 |
| 4,329,599 | A | * | 5/1982 | Gregorian | ............ | H03H 19/004 327/45 |
| 4,331,894 | A | * | 5/1982 | Gregorian | ............ | H03H 19/004 327/389 |
| 4,429,285 | A | * | 1/1984 | Bradshaw | ............ | H03G 1/0088 330/109 |
| 4,468,749 | A | * | 8/1984 | Kato | ..................... | H03H 19/004 327/337 |
| 4,496,858 | A | * | 1/1985 | Smith | ....................... | H03K 9/06 327/102 |
| 4,498,063 | A | | 2/1985 | Makabe et al. | | |
| 4,593,250 | A | | 6/1986 | Lucas et al. | | |
| 4,754,226 | A | * | 6/1988 | Lusignan | ............... | G06G 7/161 327/172 |
| 4,763,088 | A | | 8/1988 | Negahban-Hagh | | |
| 5,278,478 | A | | 1/1994 | Moody et al. | | |
| 5,376,891 | A | * | 12/1994 | Kirchlechner | ........... | H03D 1/22 327/156 |
| 5,659,269 | A | * | 8/1997 | Myers | ................... | H03H 19/004 327/156 |
| 5,821,891 | A | | 10/1998 | Shi et al. | | |
| 5,953,430 | A | | 9/1999 | Kirchlechner et al. | | |
| 6,184,811 | B1 | | 2/2001 | Nagari et al. | | |

(Continued)

*Primary Examiner* — Ryan Jager
(74) *Attorney, Agent, or Firm* — Lewis Roca Rothgerber Christie LLP

(57) ABSTRACT

A switched capacitor low-pass filter. The filter includes a plurality of switched capacitors, and a plurality of resistors. The resistors increase the slope of the roll-off of the filter, reduce DC gain variations across corners, and minimize the frequency variation across corners. In some embodiments, the clock signal used to control the switched capacitor filters has a duty cycle differing from 50%, to improve the frequency response of the filter.

20 Claims, 11 Drawing Sheets

(56) References Cited

U.S. PATENT DOCUMENTS

| | | | |
|---|---|---|---|
| 6,411,717 | B1 | 6/2002 | Lübbe et al. |
| 7,132,881 | B2 * | 11/2006 | Adan ................ H03H 11/1217 327/554 |
| 7,138,873 | B2 | 11/2006 | Chandra et al. |
| 7,683,815 | B2 | 3/2010 | Josefsson et al. |
| 7,880,538 | B2 | 2/2011 | Sharma |
| 8,638,165 | B2 | 1/2014 | Shah et al. |
| 8,754,699 | B2 | 6/2014 | Bawa et al. |
| 8,913,762 | B2 | 12/2014 | Steele et al. |
| 2016/0036460 | A1 | 2/2016 | Mattisson et al. |

\* cited by examiner $$\frac{V_{out}}{V_{in}} = \frac{-\frac{1}{C_1 C_2 R_1 R_2}}{s^2 + s\frac{1}{C_1}\left(\frac{1}{R_1} + \frac{1}{R_2} + \frac{1}{R_3}\right) + \frac{1}{C_1 C_2 R_2 R_3}}$$

FIG. 2A $$\omega_c = \frac{1}{\sqrt{R_1 R_2 C_1 C_2}}$$

FIG. 2B $$A_v = -\frac{R_1}{R_3}$$

FIG. 2C $$Q = \frac{\sqrt{\frac{C_1}{C_2}}}{\sqrt{\frac{R_1}{R_2}} + \sqrt{\frac{R_2}{R_1}} + \sqrt{\frac{R_1 R_2}{R_3}}}$$

FIG. 2D

*RELATED ART*

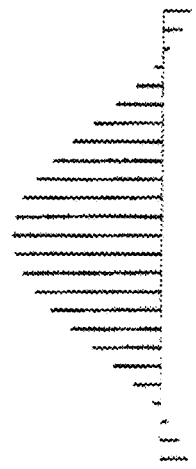
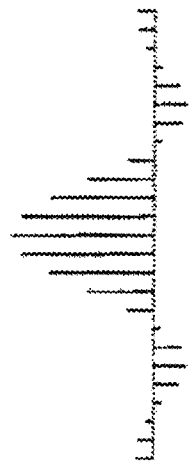
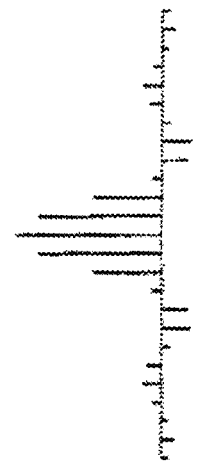
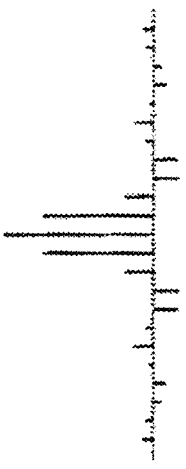
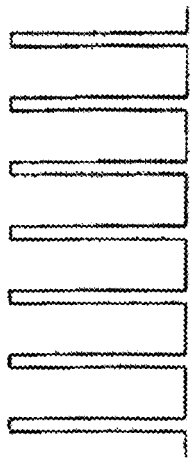
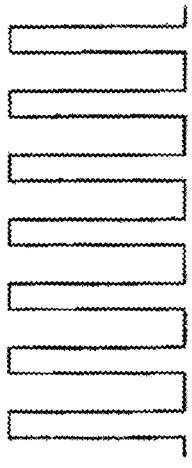
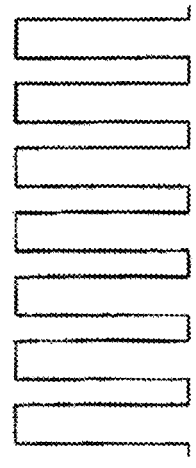
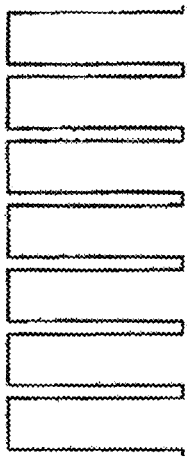
FIG. 7A  FIG. 7B  FIG. 7C  FIG. 7D

SECOND ORDER SWITCHED CAPACITOR FILTER

CROSS-REFERENCE TO RELATED APPLICATION(S)

The present application claims priority to and the benefit of U.S. Provisional Application No. 62/449,461, filed Jan. 23, 2017, entitled "2ND ORDER SWITCHED-CAPACITOR FILTER", the entire content of which is incorporated herein by reference.

FIELD

One or more aspects of embodiments according to the present invention relate to filters, and more particularly to an improved switched capacitor filter.

BACKGROUND

Filters using switched capacitors instead of resistors may be used in systems in which capacitors have certain advantages over resistors, such as a reduced sensitivity to process variations, temperature variations, and power supply variations. The roll-off in a switched-capacitor filter may be limited, however, by the sample and hold process, leading to degraded filter performance.

Thus, there is a need for a switched capacitor filter with improved frequency response.

SUMMARY

Aspects of embodiments of the present disclosure are directed toward a switched capacitor low-pass filter. The filter includes a plurality of switched capacitors, and a plurality of resistors. The resistors increase the slope of the roll-off of the filter, reduce DC gain variations across corners, and minimize the frequency variation across corners. In some embodiments, the clock signal used to control the switched capacitor filters has a duty cycle differing from 50%, to improve the frequency response of the filter.

According to an embodiment of the present invention there is provided a filter circuit, including: an operational amplifier, having an inverting input and an output; a feedback network including a first feedback path and a second feedback path, connected in parallel between the inverting input and the output, the first feedback path having an input node; and an input network including a series path connected to the input node and a shunt path connected between the input node and a first voltage reference, wherein the first feedback path includes a first series combination, of a first switched capacitor and a first resistor, the first series combination being connected to the output and to the input node, wherein the first switched capacitor has a first terminal, a second terminal, and a clock input for a clock signal, and includes: a capacitor having: a reference terminal connected to a second voltage reference, and a switched terminal; a first switch connected between the first terminal and the switched terminal and configured to be conducting when the clock signal has a first value and non-conducting when the clock signal has a second value; and a second switch connected between the second terminal and the switched terminal and configured to be non-conducting when the clock signal has the first value and conducting when the clock signal has the second value.

In one embodiment, the shunt path includes a second series combination, of a second resistor and a first capacitor.

In one embodiment, the circuit includes a clock configured to generate the clock signal, the clock signal having the first value a first fraction of the time and the second value the remainder of the time, the first fraction being between 60% and 95% of the time.

In one embodiment, the first feedback path further includes a second switched capacitor connected to the input node and to the inverting input, wherein the second switched capacitor has a first terminal, a second terminal, and a clock input for the clock signal, and includes: a capacitor having: a reference terminal connected to a third voltage reference, and a switched terminal; a first switch connected between the first terminal and the switched terminal and configured to be conducting when the clock signal has the first value and non-conducting when the clock signal has the second value; and a second switch connected between the second terminal and the switched terminal and configured to be non-conducting when the clock signal has the first value and conducting when the clock signal has the second value, and wherein the second feedback path includes a second capacitor.

In one embodiment, the series path includes a third series combination, of a third resistor and a third switched capacitor, wherein the third switched capacitor has a first terminal, a second terminal, and a clock input for the clock signal, and includes: a capacitor having: a reference terminal connected to a fourth voltage reference, and a switched terminal; a first switch connected between the first terminal and the switched terminal and configured to be conducting when the clock signal has the first value and non-conducting when the clock signal has the second value; and a second switch connected between the second terminal and the switched terminal and configured to be non-conducting when the clock signal has the first value and conducting when the clock signal has the second value.

In one embodiment, the circuit includes a clock configured to generate a clock signal at a clock frequency, wherein a reciprocal of a product of a value of the third resistor and a value of the capacitor of the third switched capacitor is between one half the clock frequency and twice the clock frequency.

In one embodiment, a product of the value of the first resistor and the value of the capacitor of the first switched capacitor is between: one half the product of the value of the third resistor and the value of the capacitor of the third switched capacitor; and twice the product of the value of the third resistor and the value of the capacitor of the third switched capacitor.

In one embodiment, the shunt path includes a second series combination, of a second resistor and a first capacitor.

In one embodiment, a product of a value of the second resistor and a value of the first capacitor is between: one half the product of the value of the first resistor and the value of the capacitor of the first switched capacitor; and twice the product of the value of the first resistor and the value of the capacitor of the first switched capacitor.

In one embodiment, the clock signal has the first value a first fraction of the time and the second value the remainder of the time, the first fraction being between 60% and 95% of the time.

In one embodiment, the clock signal has the first value a first fraction of the time and the second value the remainder of the time, the first fraction being between 60% and 95% of the time.

In one embodiment, the clock signal has the first value a first fraction of the time and the second value the remainder of the time, the first fraction being between 60% and 95% of the time.

In one embodiment, the shunt path includes a second series combination, of a second resistor and a first capacitor.

In one embodiment, the circuit includes a clock configured to generate the clock signal, the clock signal having the first value a first fraction of the time and the second value the remainder of the time, the first fraction being between 60% and 95% of the time.

In one embodiment, the first voltage reference; the second voltage reference; and the fourth voltage reference are ground.

According to an embodiment of the present invention there is provided a filter circuit, including: an operational amplifier, having an inverting input and an output; a feedback network including a first feedback path and a second feedback path, connected in parallel between the inverting input and the output, the first feedback path having an input node; and an input network including a series path connected to the input node and a shunt path connected between the input node and a first voltage reference, the series path including a third series combination, of a third resistor and a third switched capacitor, wherein the third switched capacitor has a first terminal, a second terminal, and a clock input for a clock signal, and includes: a capacitor having: a reference terminal connected to a second voltage reference, and a switched terminal; a first switch connected between the first terminal and the switched terminal and configured to be conducting when the clock signal has a first value and non-conducting when the clock signal has a second value; and a second switch connected between the second terminal and the switched terminal and configured to be non-conducting when the clock signal has the first value and conducting when the clock signal has the second value.

In one embodiment, the circuit includes a clock configured to generate the clock signal, the clock signal having the first value a first fraction of the time and the second value the remainder of the time, the first fraction being between 60% and 95% of the time.

In one embodiment, the clock signal has clock frequency, wherein a reciprocal of a product of a value of the third resistor and a value of the capacitor of the third switched capacitor is between one half the clock frequency and twice the clock frequency.

In one embodiment, the shunt path includes a second series combination, of a second resistor and a first capacitor.

According to an embodiment of the present invention there is provided a filter circuit, including: an operational amplifier, having an inverting input and an output; a feedback network including a first feedback path and a second feedback path, connected in parallel between the inverting input and the output, the first feedback path having an input node; an input network including a series path connected to the input node and a shunt path connected between the input node and a first voltage reference; and a clock configured to generate a clock signal having a first value a first fraction of the time and a second value the remainder of the time, the first fraction being between 60% and 95% of the time, wherein the first feedback path further includes a second switched capacitor connected to the input node and to the inverting input, wherein the second switched capacitor has a first terminal, a second terminal, and a clock input for the clock signal, and includes: a capacitor having: a reference terminal connected to a second voltage reference, and a switched terminal; a first switch connected between the first terminal and the switched terminal and configured to be conducting when the clock signal has the first value and non-conducting when the clock signal has the second value; and a second switch connected between the second terminal and the switched terminal and configured to be non-conducting when the clock signal has the first value and conducting when the clock signal has the second value.

BRIEF DESCRIPTION OF THE DRAWINGS

These and other features and advantages of the present invention will be appreciated and understood with reference to the specification, claims, and appended drawings wherein:

FIG. 2A is an equation related to the behavior of a second order filter;

FIG. 2B is an equation related to the behavior of a second order filter;

FIG. 2C is an equation related to the behavior of a second order filter;

FIG. 2D is an equation related to the behavior of a second order filter;

FIG. 7A is a pair of graphs, showing a square wave, and the spectrum of the square wave;

FIG. 7B is a pair of graphs, showing a square wave, and the spectrum of the square wave;

FIG. 7C is a pair of graphs, showing a square wave, and the spectrum of the square wave;

FIG. 7D is a pair of graphs, showing a square wave, and the spectrum of the square wave;

DETAILED DESCRIPTION

The detailed description set forth below in connection with the appended drawings is intended as a description of exemplary embodiments of a second order switched capacitor filter provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
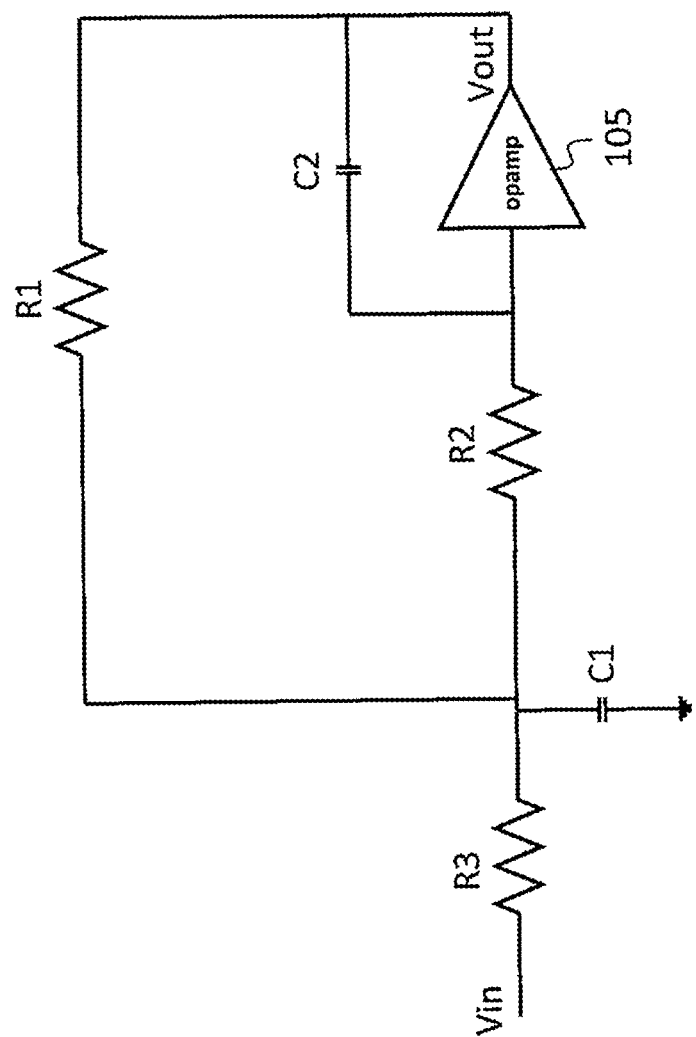
FIG. 1 is a schematic diagram of a second order filter.

Referring to FIG. 1, a related-art second order filter may include an operational amplifier 105, two capacitors C1, C2 and three resistors R1, R2, R3. The transfer function of this filter may be given by the equation of FIG. 2A, with the corner frequency (i.e., the angular frequency, in radians/ second) given by the equation of FIG. 2B, the DC gain given by the equation of FIG. 2C, and the quality factor given by the equation of FIG. 2D. The values of R1, R2, R3, C1, and C2 may be selected so that the resistors have equal or similar values, and so that the capacitors have equal or similar values, to minimize the variation of the filter characteristics across corners (e.g., process corners).

Figure 3:
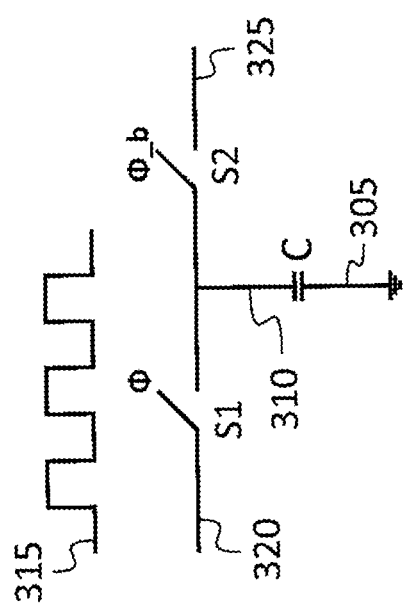
FIG. 3 is a schematic diagram of a switched capacitor.

Switched capacitors may be used instead of resistors. Referring to FIG. 3, in some embodiments each switched capacitor includes (e.g., consists of) a capacitor C, having a reference terminal 305 connected a voltage reference (e.g., ground), and a switched terminal 310; a first switch S1 is connected to a first terminal 320 and the switched terminal 310. A second switch S2 is connected to the second terminal 325 and the switched terminal 310. The switches S1, S2 are controlled so that only one is closed at a time. For example, the two switches S1, S2 may be controlled by opposite phases ($\varphi$ and $\varphi\_b$) of a two-phase clock, so that during each half cycle one of the two switches S1, S2 is open and the other is closed. Each phase of the clock may be a square wave 315 with a 50% duty cycle. For a given voltage difference, between a first voltage at the first terminal 320 of the switched capacitor and a second voltage at the second terminal 325, a charge equal to the voltage difference times the value (i.e., the capacitance) of the capacitor C may be transferred, during each clock cycle, from the first terminal 320 to the second terminal 325. The average current flowing from the first terminal 320 to the second terminal 325 is proportional to the voltage drop and the element behaves, on average, like a resistor. Accordingly, a switched capacitor may be substituted for each of the resistors of the circuit of FIG. 1, as shown in FIG. 3, to form an analogous filter.

Figure 5:
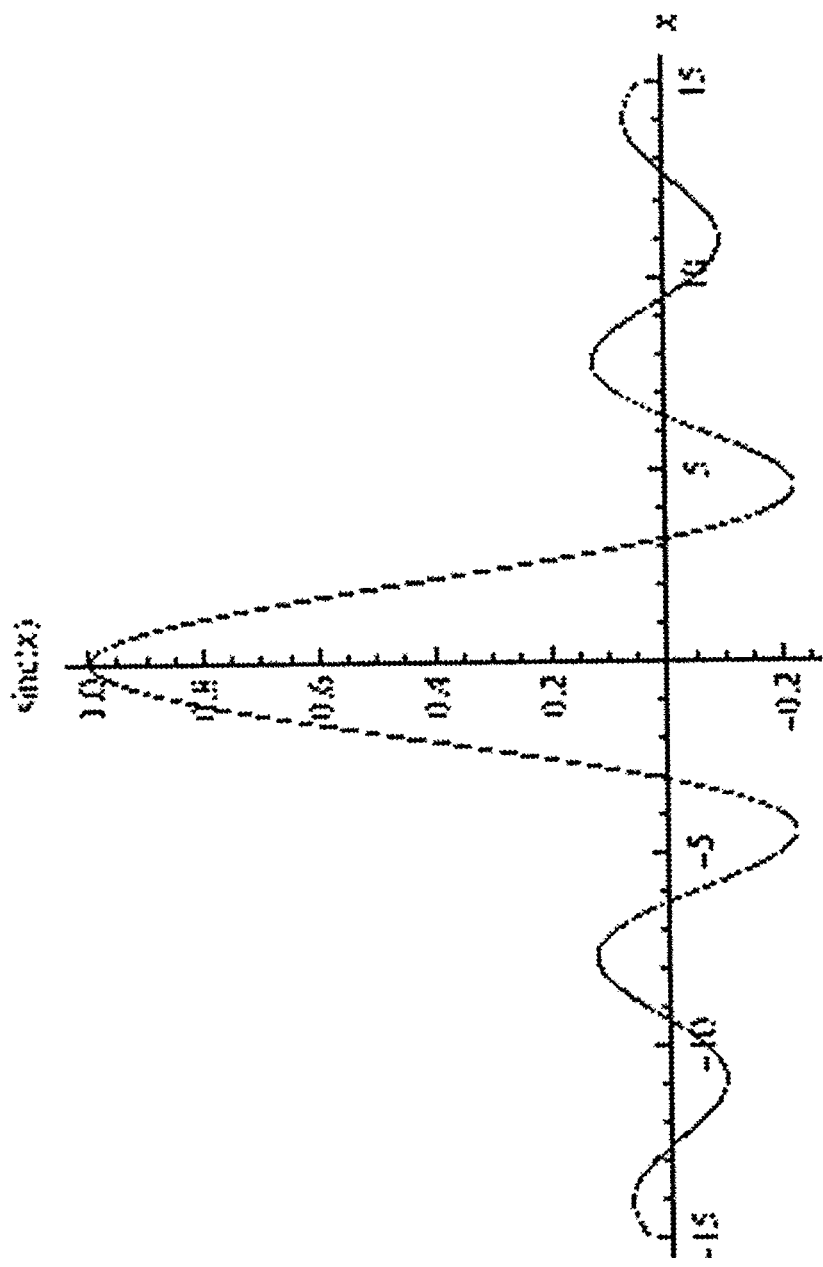
FIG. 5 is a graph of a sinc function.

Each switched capacitor may be characterized by a sample and hold function, with, for example, the capacitor storing, at the point in time at which the switch S1 opens, the instantaneous voltage at the first terminal 320. The transfer function of a sample and hold function may be a sine function, e.g., as illustrated in the graph of FIG. 5, which is a graph of sinc(x) as a function of x. The sine function may degrade the roll-off characteristics of a filter using switched capacitors.

Figure 4:
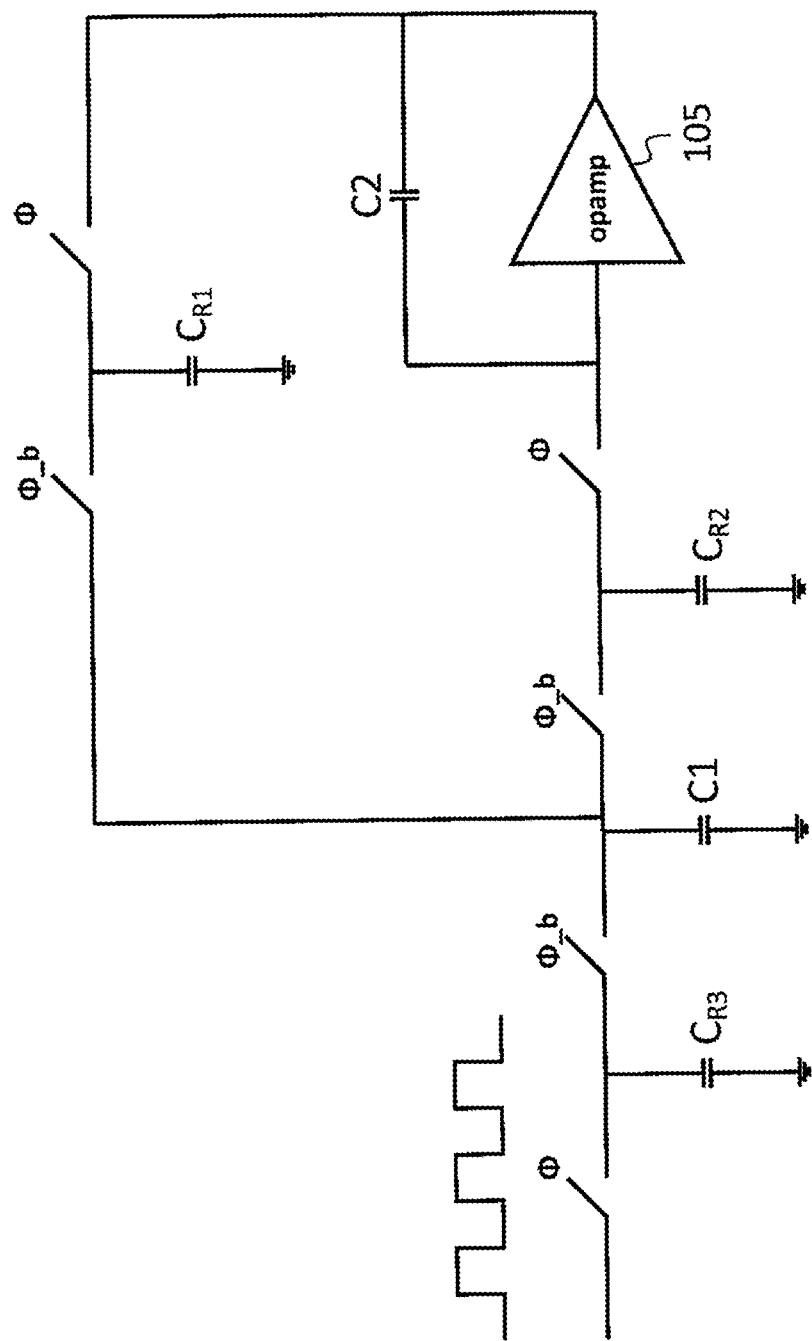
FIG. 4 is a schematic diagram of a second order switched capacitor filter.
Figure 6:
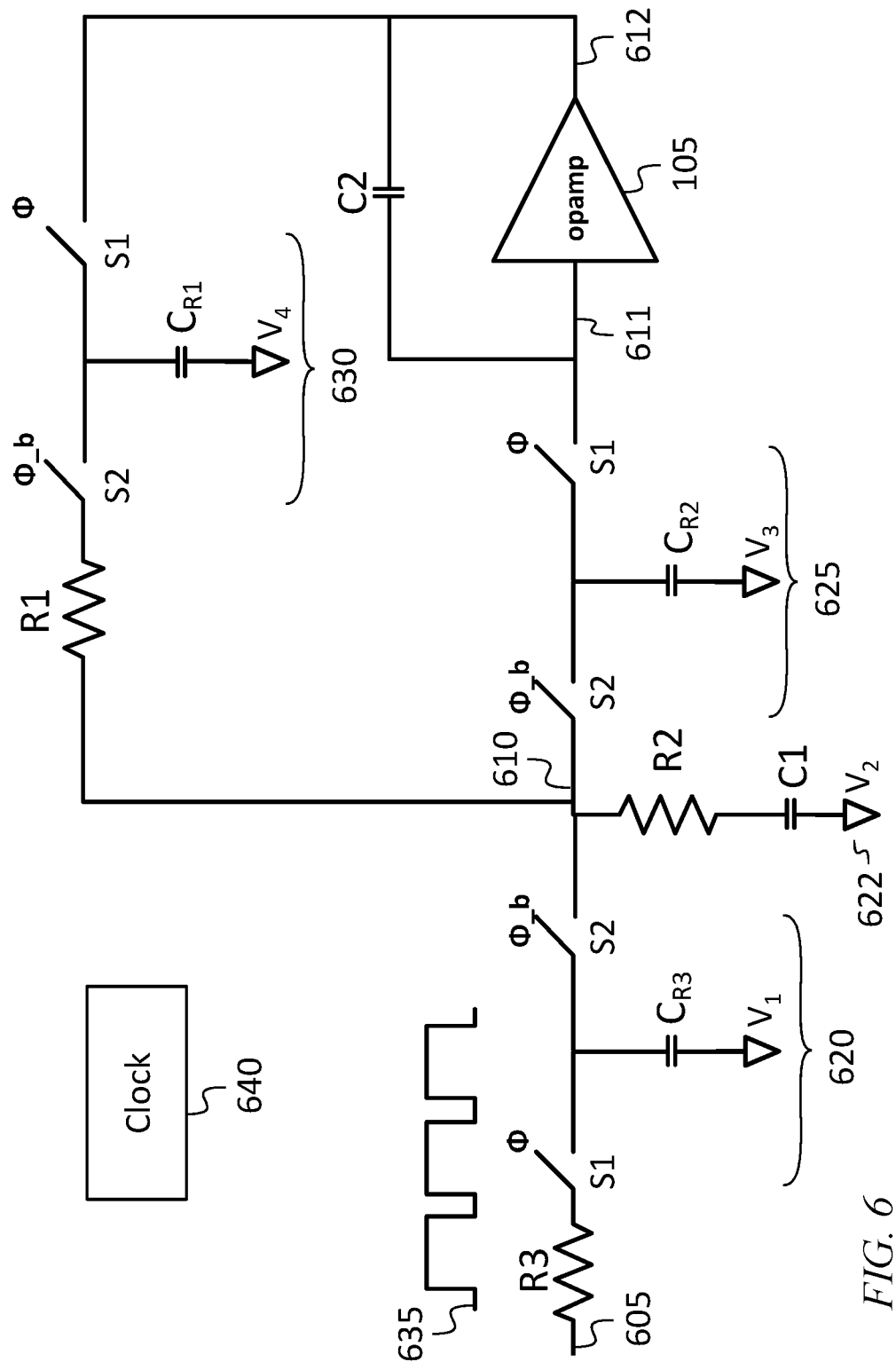
FIG. 6 is a schematic diagram of a second order switched capacitor filter, according to an embodiment of the present invention.

Referring to FIG. 6, in some embodiments the circuit of FIG. 4 may be modified by the inclusion of one or more of the three resistors R1, R2, and R3. The circuit of FIG. 6 includes an operational amplifier 105, having an inverting input 611 (the noninverting input is not shown, or, e.g., connected to ground internally) and an output 612 which also serves as the output 612 of the filter. A feedback network is connected between the output 612 of the operational amplifier 105 and the inverting input 611 of the operational amplifier 105, and an input network is connected to an input 605 of the filter and to an input node 610 of the feedback network. The output 612 of the operational amplifier 105 is, as mentioned above, the output 612 of the filter.

The feedback network includes a first path and a second path. The first path of the feedback network includes (i) a first series combination, of a first switched capacitor 630 and the first resistor R1, connected between the output 612 and the input node 610, and (ii) a second switched capacitor 625, connected between the input node 610 and the inverting input 611. The second path of the feedback network includes a second capacitor C2.

The input network includes (i) a shunt path including a second series combination, of the second resistor R2 and the first capacitor C1, connected between the input node 610 and a voltage reference (e.g., ground) 622, and (ii) a series path including a third series combination, of the third resistor R3 and a third switched capacitor 620, connected between the filter input 605 and the input node 610.

A clock 640 may provide two complementary clock signals ($\varphi$ and $\varphi\_b$) to the switches S1 and S2 respectively, so that at all times (except possibly for short time intervals during transitions) one switch of each pair of switches S1, S2 is open and the other is closed. In some embodiments the clock 640 instead generates a single signal and the switches S1 and S2 are configured to respond in opposite fashion to the signal (e.g., S1 being closed and S2 being open when the clock signal is high, and S1 being open and S2 being closed when the clock signal is low).

A high-frequency pole may be added near the clock frequency by adding the third resistor R3 as shown. The combination of R3 and the capacitor $C_{R3}$ of the third switched capacitor 620 creates a pole. The third resistor R3 may be sized such that the new pole is approximately at the sampling frequency of the clock 640, since this is the frequency at which the sine function begins to degrade the roll-off of the filter. For example, R3 may have a value (i.e., a resistance) of $1/(2\text{ pi } f_s\ C_{R3})$, where $f_s$ is the clock frequency, and $C_{R3}$ is the value (i.e., the capacitance) of capacitor $C_{R3}$. In other embodiments, R3 may have a value between $0.5/(2\text{ pi } f_s\ C_{R3})$ and $2.0/(2\text{ pi } f_s\ C_{R3})$. This condition may equivalently be expressed as follows: a reciprocal of a product of a value of the third resistor and a value of the capacitor of the third switched capacitor may be between one half the clock frequency and twice the clock frequency.

In some embodiments, the first resistor R1 may be included in the circuit, connected in series with the first switched capacitor 630, to reduce the DC gain variation across corners. The resistor R1 may be sized such that R1 $C_{R1}$=R3 $C_{R3}$, or, in some embodiments, so that R1 $C_{R1}$ has a value between 0.5 R3 $C_{R3}$ and 2.0 R3 $C_{R3}$.

In some embodiments, the second resistor R2 may be included in the circuit, connected in series with the first capacitor C1 as part of the shunt path of the input network, as shown in FIG. 6, to reduce the frequency variation across corners. The resistor R2 may be sized such that R2 C1=R1 $C_{R1}$, or, in some embodiments, so that R2 C1 has a value between 0.5 R1 $C_{R1}$ and 2.0 R1 $C_{R1}$.

A clock 640 with a duty cycle greater than 50% may also be used to improve the roll-off of the filter. For example, one phase of the clock signal may be a square wave 635 with a duty cycle of about 80%, i.e., each first switch S1 may be closed 80% of the time and open 20% of the time, and each second switch S2 may be open 80% of the time and closed 20% of the time. FIGS. 7A-7D show time domain square waves (on the left side of each of FIGS. 7A-7D) and the corresponding spectra (on the right side of each of FIGS. 7A-7D), for each of four different values of the duty cycle (20% for FIG. 7A, 40% for FIG. 7B, 60% for FIG. 7C, and 80% for FIG. 7D). It may be seen that a higher duty cycle (e.g., 80%) results in a more rapid roll-off in the envelope. In some embodiments the duty cycle is between 60% and 95%.

EXAMPLE

In one example, the following parameter values are selected for an exemplary filter design, based on a design 3 dB frequency of 500 kHz, and a clock frequency of 5 MHz:

C1=4.5 pF, C2=1.5 pF, CR1=CR2=CR3=2.5 pF,
R1=15 kΩ, R2=50 kΩ, R3=100 kΩ, and
clock duty cycle: 80%.

Figure 8:
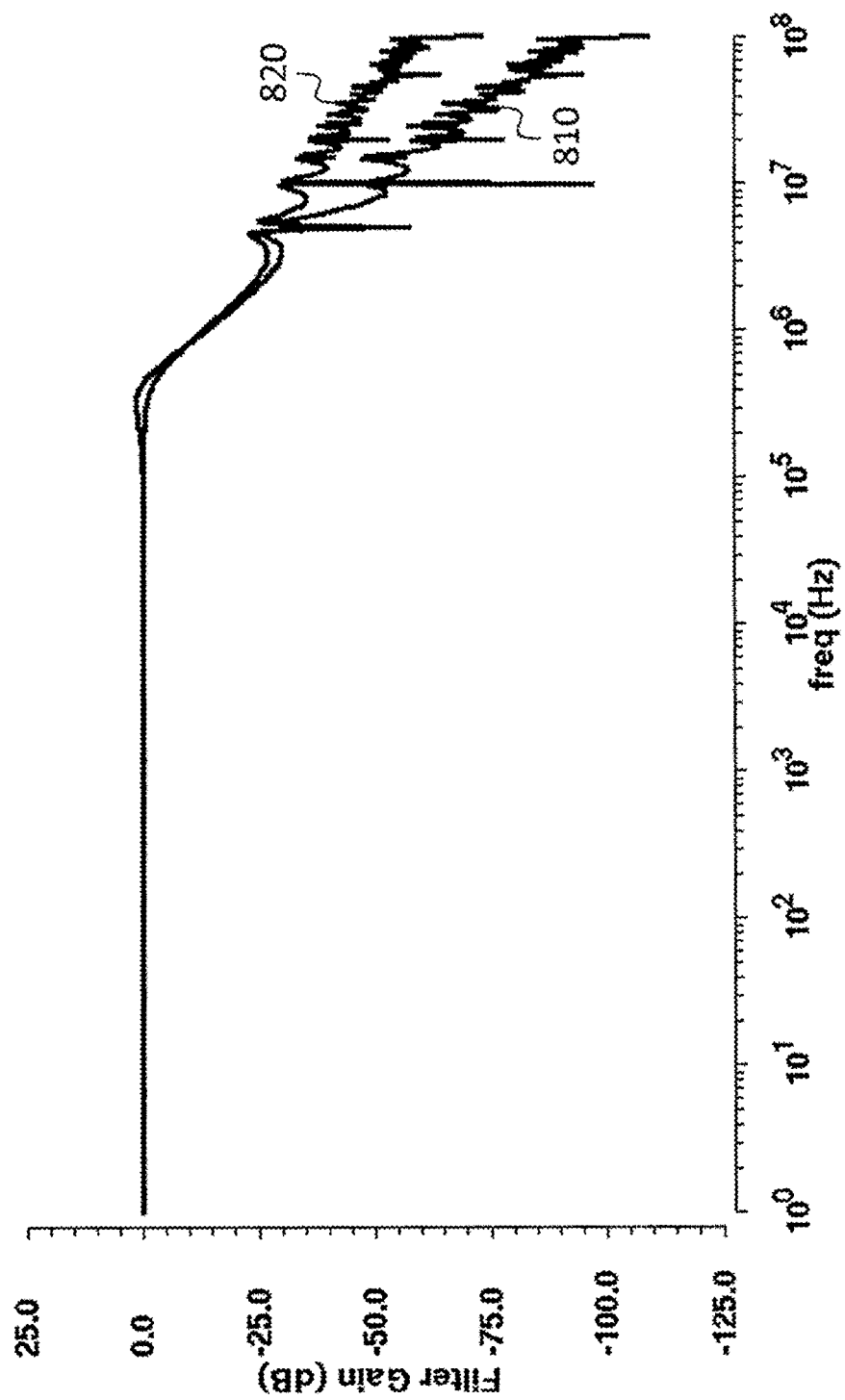
FIG. 8 is a graph of filter frequency responses, according to an embodiment of the present invention.

FIGS. 8-11 show the performance of such a filter, as well as alternate embodiments including some but not all of the resistor, or having a clock duty cycle of 50%. FIG. 8 shows the simulated frequency response of a version of the exemplary filter in which R3=100 kΩ, the clock duty cycle is 50%, and R1=R2=0 (to show the effect of R3 alone). The simulated frequency response of this filter is plotted as a first curve 810 in FIG. 8. The simulated frequency response of a related art filter according to FIG. 4 is plotted as a second curve 820 for comparison. For the related art filter, the clock duty cycle is 50%, and:

C1=6 pF, C2=2 pF, and
CR1=CR2=CR3=2.5 pF

Figure 9:
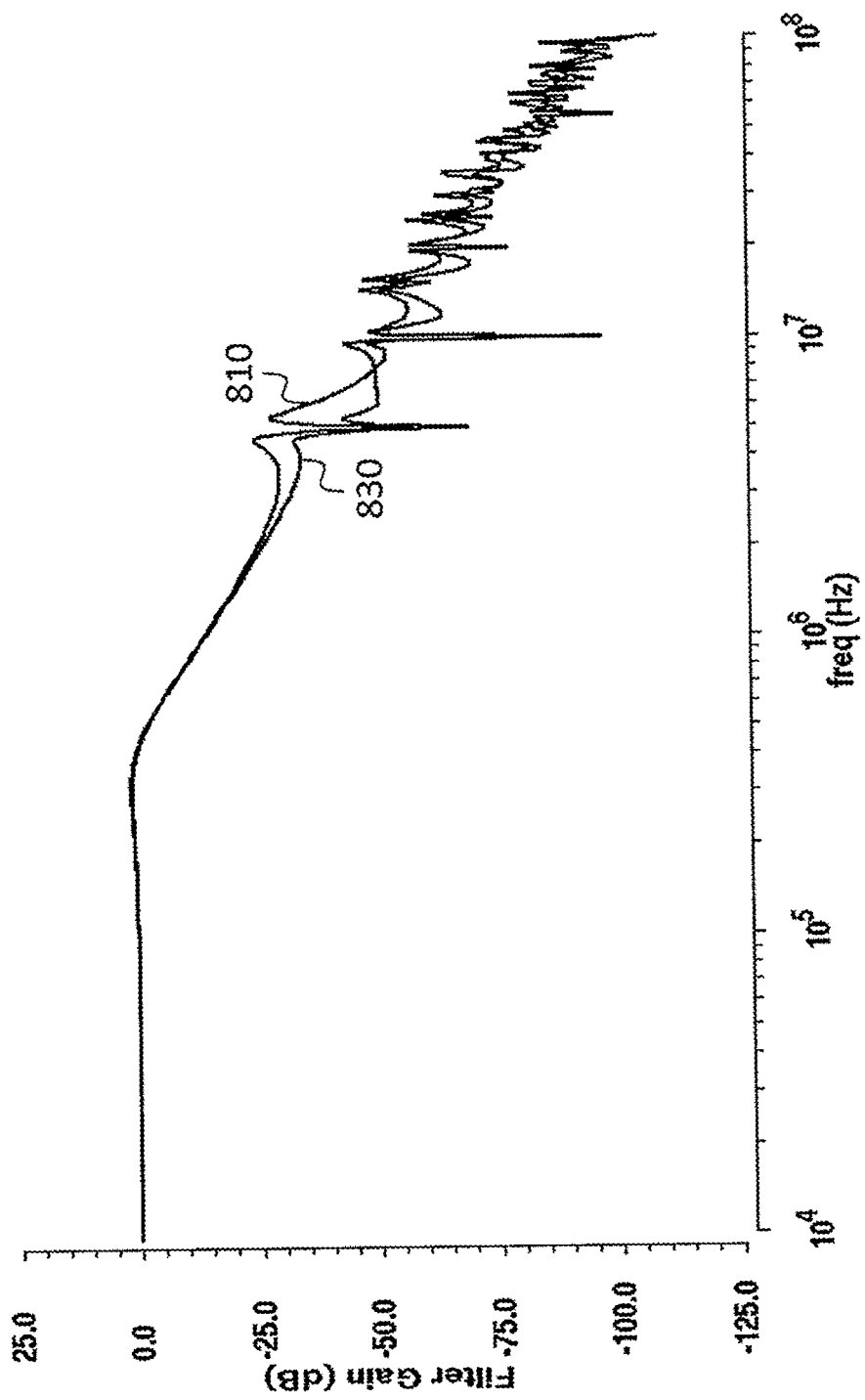
FIG. 9 is a graph of filter frequency responses, according to an embodiment of the present invention.

FIG. 9 shows, in a curve 810, the simulated frequency response of the filter in which R3=100 kΩ, the clock duty cycle is 50%, and R1=R2=0, along with the simulated frequency response, in a curve 830, of a filter in which R3=100 kΩ, R1=R2=0, and the clock duty cycle is 80%.

Figure 10:
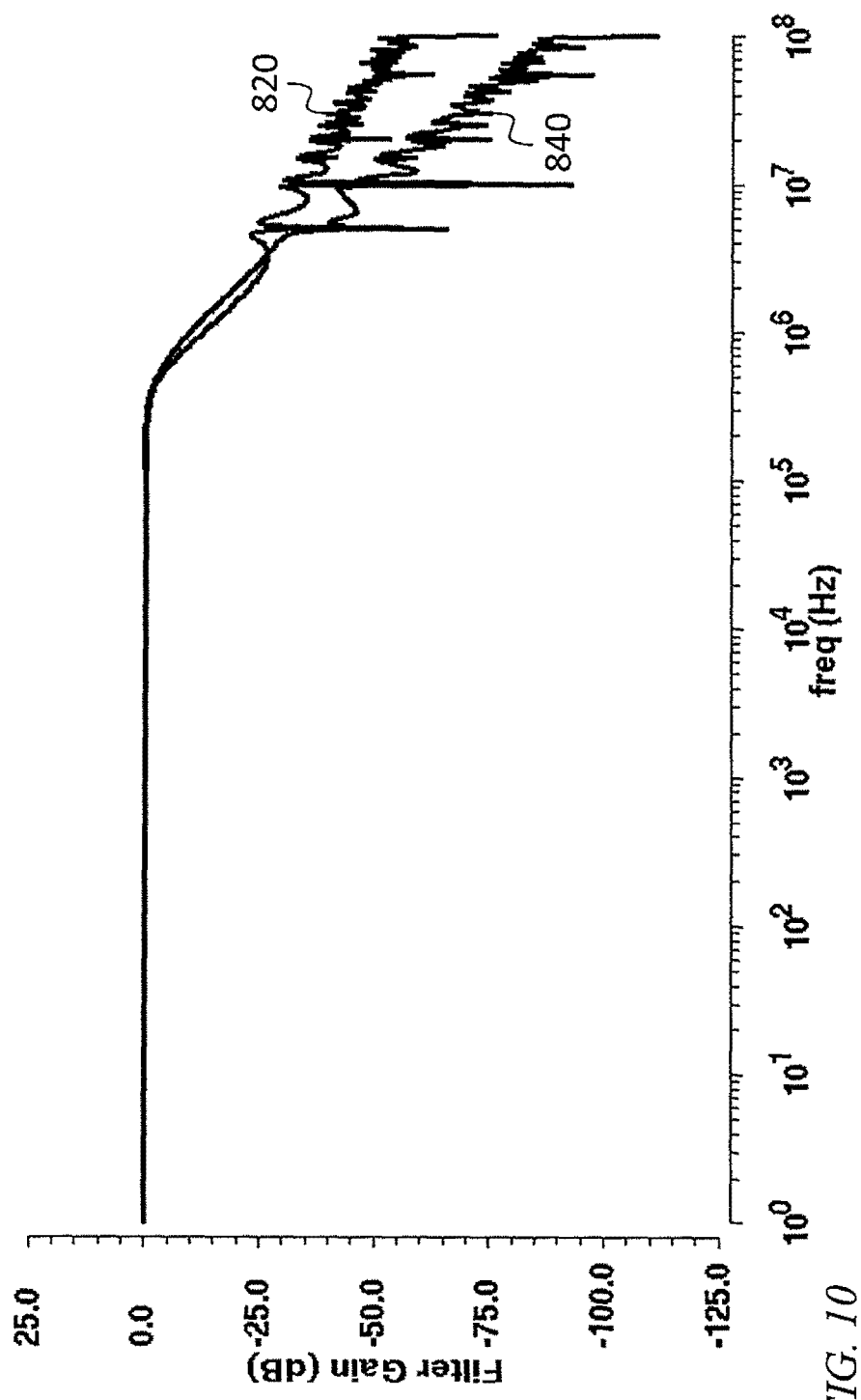
FIG. 10 is a graph of filter frequency responses, according to an embodiment of the present invention.
Figure 11:
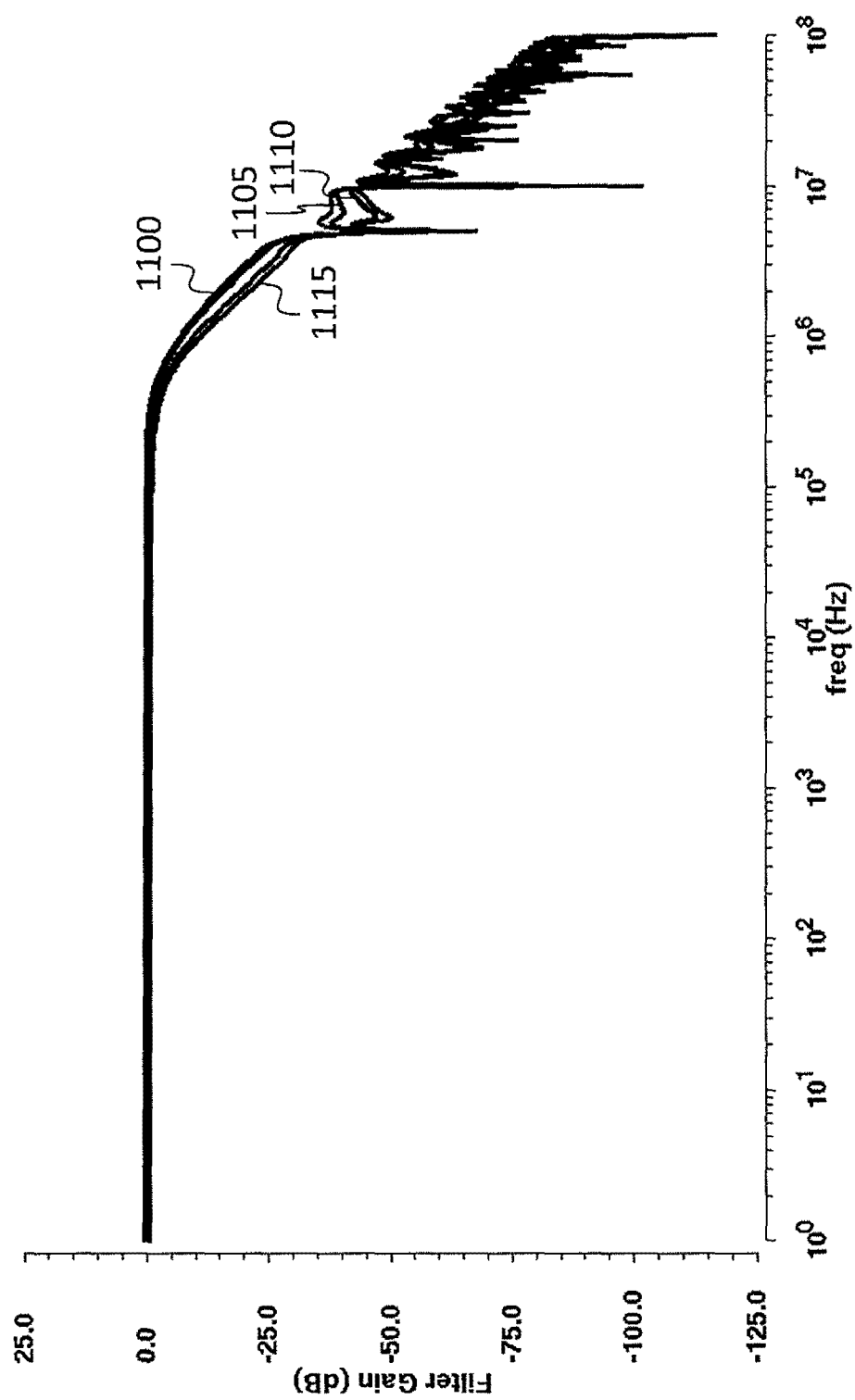
FIG. 11 is a graph of filter frequency responses, according to an embodiment of the present invention.

FIG. 10 shows, in a curve 840, the simulated frequency response of the filter in which R1=15 kΩ, R2=50 kΩ, R3=100 kΩ, and the clock duty cycle is 80%. The simulated frequency response of the related art filter according to FIG. 4 is plotted as a second curve 820 for comparison. FIG. 11 shows four simulated frequency response curves 1100, 1105, 1110, 1115 corresponding to DC gain variations of +/−7% and variation of +/−8% in the 3 dB frequency.

In view of the foregoing, some embodiments provide a switched capacitor low-pass filter. The filter includes a plurality of switched capacitors, and a plurality of resistors. The resistors increase the slope of the roll-off of the filter, reduce DC gain variations across corners, and minimize the frequency variation across corners. In some embodiments, the clock signal used to control the switched capacitor filters has a duty cycle differing from 50%, to improve the frequency response of the filter.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a second order switched capacitor filter have been specifically described and illustrated herein, many modifications and variations will be apparent to those skilled in the art. Accordingly, it is to be understood that a second order switched capacitor filter constructed according to principles of this invention may be embodied other than as specifically described herein. The invention is also defined in the following claims, and equivalents thereof.

What is claimed is:

1. A filter circuit, comprising:
   an operational amplifier, having an inverting input and an output;
   a feedback network comprising a first feedback path and a second feedback path, connected in parallel between the inverting input and the output, the first feedback path having an input node; and
   an input network comprising a series path connected to the input node and a shunt path connected between the input node and a first voltage reference, wherein the first feedback path comprises a first series combination, of a first switched capacitor and a first resistor, the first series combination being connected to the output and to the input node, wherein the first switched capacitor has a first terminal, a second terminal, and a clock input for a clock signal, and comprises:
  a capacitor having:
    a reference terminal connected to a second voltage reference, and
    a switched terminal;
  a first switch connected between the first terminal and the switched terminal and configured to be conducting when the clock signal has a first value and non-conducting when the clock signal has a second value; and
  a second switch connected between the second terminal and the switched terminal and configured to be non-conducting when the clock signal has the first value and conducting when the clock signal has the second value.

2. The circuit of claim 1, wherein the shunt path comprises a second series combination, of a second resistor and a first capacitor.

3. The circuit of claim 1, further comprising a clock configured to generate the clock signal, the clock signal having the first value a first fraction of the time and the second value the remainder of the time, the first fraction being between 60% and 95% of the time.

4. The circuit of claim 1, wherein the first feedback path further comprises a second switched capacitor connected to the input node and to the inverting input, wherein the second switched capacitor has a first terminal, a second terminal, and a clock input for the clock signal, and comprises:
  a capacitor having:
    a reference terminal connected to a third voltage reference, and
    a switched terminal;
  a first switch connected between the first terminal and the switched terminal and configured to be conducting when the clock signal has the first value and non-conducting when the clock signal has the second value; and
  a second switch connected between the second terminal and the switched terminal and configured to be non-conducting when the clock signal has the first value and conducting when the clock signal has the second value, and
wherein the second feedback path comprises a second capacitor.

5. The circuit of claim 4, wherein the series path comprises a third series combination, of a third resistor and a third switched capacitor, wherein the third switched capacitor has a first terminal, a second terminal, and a clock input for the clock signal, and comprises:
  a capacitor having:
    a reference terminal connected to a fourth voltage reference, and
    a switched terminal;
  a first switch connected between the first terminal and the switched terminal and configured to be conducting when the clock signal has the first value and non-conducting when the clock signal has the second value; and
  a second switch connected between the second terminal and the switched terminal and configured to be non-conducting when the clock signal has the first value and conducting when the clock signal has the second value.

6. The circuit of claim 5, further comprising a clock configured to generate a clock signal at a clock frequency, wherein a reciprocal of a product of a value of the third resistor and a value of the capacitor of the third switched capacitor is between one half the clock frequency and twice the clock frequency.

7. The circuit of claim 6, wherein a product of the value of the first resistor and the value of the capacitor of the first switched capacitor is between;
  one half the product of the value of the third resistor and the value of the capacitor of the third switched capacitor; and
  twice the product of the value of the third resistor and the value of the capacitor of the third switched capacitor.

8. The circuit of claim 7, wherein the shunt path comprises a second series combination, of a second resistor and a first capacitor.

9. The circuit of claim 8, wherein a product of a value of the second resistor and a value of the first capacitor is between:
  one half the product of the value of the first resistor and the value of the capacitor of the first switched capacitor; and
  twice the product of the value of the first resistor and the value of the capacitor of the first switched capacitor.

10. The circuit of claim 9, wherein the clock signal has the first value a first fraction of the time and the second value the remainder of the time, the first fraction being between 60% and 95% of the time.

11. The circuit of claim 8, wherein the clock signal has the first value a first fraction of the time and the second value the remainder of the time, the first fraction being between 60% and 95% of the time.

12. The circuit of claim 7, wherein the clock signal has the first value a first fraction of the time and the second value the remainder of the time, the first fraction being between 60% and 95% of the time.

13. The circuit of claim 5, wherein the shunt path comprises a second series combination, of a second resistor and a first capacitor.

14. The circuit of claim 5, further comprising a clock configured to generate the clock signal, the clock signal having the first value a first fraction of the time and the second value the remainder of the time, the first fraction being between 60% and 95% of the time.

15. The circuit of claim 14, wherein:
  the first voltage reference;
  the second voltage reference; and
  the fourth voltage reference
are ground.

16. A filter circuit, comprising:
  an operational amplifier, having an inverting input and an output;
  a feedback network comprising a first feedback path and a second feedback path, connected in parallel between the inverting input and the output, the first feedback path having an input node; and
  an input network comprising a series path connected to the input node and a shunt path connected between the input node and a first voltage reference,
  the series path comprising a third series combination, of a third resistor and a third switched capacitor, wherein the third switched capacitor has a first terminal, a second terminal, and a clock input for a clock signal, and comprises:
- a capacitor having:
  - a reference terminal connected to a second voltage reference, and
  - a switched terminal;
- a first switch connected between the first terminal and the switched terminal and configured to be conducting when the clock signal has a first value and non-conducting when the clock signal has a second value; and
- a second switch connected between the second terminal and the switched terminal and configured to be non-conducting when the clock signal has the first value and conducting when the clock signal has the second value.

17. The circuit of claim 16, further comprising a clock configured to generate the clock signal, the clock signal having the first value a first fraction of the time and the second value the remainder of the time, the first fraction being between 60% and 95% of the time.

18. The circuit of claim 17, wherein the clock signal has clock frequency, wherein a reciprocal of a product of a value of the third resistor and a value of the capacitor of the third switched capacitor is between one half the clock frequency and twice the clock frequency.

19. The circuit of claim 18, wherein the shunt path comprises a second series combination, of a second resistor and a first capacitor.

20. A filter circuit, comprising:
- an operational amplifier, having an inverting input and an output;
- a feedback network comprising a first feedback path and a second feedback path, connected in parallel between the inverting input and the output, the first feedback path having an input node;
- an input network comprising a series path connected to the input node and a shunt path connected between the input node and a first voltage reference; and
- a clock configured to generate a clock signal having a first value a first fraction of the time and a second value the remainder of the time, the first fraction being between 60% and 95% of the time, wherein the first feedback path further comprises a second switched capacitor connected to the input node and to the inverting input, wherein the second switched capacitor has a first terminal, a second terminal, and a clock input for the clock signal, and comprises:
- a capacitor having:
  - a reference terminal connected to a second voltage reference, and
  - a switched terminal;
- a first switch connected between the first terminal and the switched terminal and configured to be conducting when the clock signal has the first value and non-conducting when the clock signal has the second value; and
- a second switch connected between the second terminal and the switched terminal and configured to be non-conducting when the clock signal has the first value and conducting when the clock signal has the second value.

* * * * *